US009360769B2

(12) United States Patent
Kisteman et al.

(10) Patent No.: US 9,360,769 B2
(45) Date of Patent: Jun. 7, 2016

(54) METHOD OF DETERMINING FOCUS CORRECTIONS, LITHOGRAPHIC PROCESSING CELL AND DEVICE MANUFACTURING METHOD

(75) Inventors: Arend Johannes Kisteman, Eindhoven (NL); Wim Tjibbo Tel, Helmond (NL); Thomas Theeuwes, Veldhoven (NL); Antoine Gaston Marie Kiers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 509 days.

(21) Appl. No.: 13/571,963

(22) Filed: Aug. 10, 2012

(65) Prior Publication Data
US 2013/0050668 A1 Feb. 28, 2013

Related U.S. Application Data

(60) Provisional application No. 61/529,586, filed on Aug. 31, 2011.

(51) Int. Cl.
*G03B 27/32* (2006.01)
*G03B 27/52* (2006.01)
(Continued)

(52) U.S. Cl.
CPC ........ *G03F 7/70641* (2013.01); *G03F 7/70616* (2013.01); *G03F 7/70625* (2013.01); *G03F 9/7026* (2013.01)

(58) Field of Classification Search
CPC ............ G03F 7/70616; G03F 7/70625; G03F 7/70641; G03F 7/70683; G03F 9/7023; G03F 9/7026; G03F 9/7034

USPC ......................................... 355/55, 77; 430/30
See application file for complete search history.

(56) References Cited

U.S. PATENT DOCUMENTS 5,483,056 A  1/1996  Imai
5,747,202 A  5/1998  Tanaka
5,898,479 A  4/1999  Hubbard et al.
(Continued)

FOREIGN PATENT DOCUMENTS

EP  1 628 164 A2  2/2006
EP  2 063 321 A2  5/2009
(Continued)

OTHER PUBLICATIONS

Ausschnitt, C.P., et al., "Distinguishing dose, focus and blur for lithography characterization and control," Proceedings of SPIE, Optical Microlithography XX, vol. 6520; pp. 65200M-1 to 65200M-8 (2007).
(Continued)

*Primary Examiner* — Colin Kreutzer
(74) *Attorney, Agent, or Firm* — Sterne, Kessler, Goldstein & Fox P.L.L.C.

(57) ABSTRACT

A method of, and associated apparatus for, determining focus corrections for a lithographic projection apparatus. The method comprises exposing a plurality of global correction fields on a test substrate, each comprising a plurality of global correction marks, and each being exposed with a tilted focus offset across it; measuring a focus dependent characteristic for each of the plurality of global correction marks to determine interfield focus variation information; and calculating interfield focus corrections from the interfield focus variation information.

9 Claims, 8 Drawing Sheets

(51) Int. Cl.
  *G03F 7/20* (2006.01)
  *G03F 9/00* (2006.01)

(56) References Cited

U.S. PATENT DOCUMENTS

| | | | |
|---|---|---|---|
| 6,278,515 | B1 | 8/2001 | Knight et al. |
| 6,295,629 | B1 | 9/2001 | Suganaga |
| 6,509,952 | B1 | 1/2003 | Govil et al. |
| 7,016,025 | B1 | 3/2006 | Hansen |
| 7,651,826 | B2 | 1/2010 | Takahara et al. |
| 7,916,284 | B2 | 3/2011 | Dusa et al. |
| 8,120,748 | B2 | 2/2012 | Geh et al. |
| 8,830,447 | B2 | 9/2014 | Den Boef et al. |
| 2003/0211700 | A1* | 11/2003 | Leung et al. ............ 438/401 |
| 2005/0094132 | A1* | 5/2005 | Starikov et al. ......... 356/123 |
| 2006/0209276 | A1 | 9/2006 | Smith et al. |
| 2007/0035712 | A1* | 2/2007 | Gassner et al. .......... 355/55 |
| 2007/0072091 | A1 | 3/2007 | Smith et al. |
| 2007/0252963 | A1 | 11/2007 | Modderman et al. |
| 2009/0135389 | A1 | 5/2009 | Hofmans et al. |
| 2010/0040987 | A1 | 2/2010 | Temchenko et al. |
| 2010/0110401 | A1 | 5/2010 | Chung |
| 2010/0216064 | A1 | 8/2010 | Takimoto et al. |
| 2011/0051116 | A1 | 3/2011 | Izikson et al. |
| 2011/0205511 | A1 | 8/2011 | Padiy et al. |
| 2011/0249247 | A1 | 10/2011 | Cramer et al. |
| 2015/0085267 | A1 | 3/2015 | Kisteman et al. |

FOREIGN PATENT DOCUMENTS

| | | |
|---|---|---|
| JP | 06-349696 A | 12/1994 |
| JP | 07-111233 A | 4/1995 |
| JP | 10-254123 A | 9/1998 |
| JP | 2001-035785 A | 2/2001 |
| JP | 2010-199159 A | 9/2010 |
| TW | 200813654 A | 3/2008 |
| TW | 201033754 A1 | 9/2010 |
| TW | 201106116 A1 | 2/2011 |
| WO | WO 2006/059377 A1 | 6/2006 |
| WO | WO 2010/076232 A2 | 7/2010 |

OTHER PUBLICATIONS

Ausschnitt, C. P., et al., "Modeling for Profile-Based Process-Window Metrology," Proceedings of SPIE, Data Analysis and Modeling for Process Control, vol. 5378; pp. 38-47 (2004).

Charley, A.-L., et al., "Focus and dose de-convolution technique for improved CD control of immersion clusters," Proceedings of SPIE, Metrology, Inspection, and Process Control for Microlithography XXIV, vol. 7638; pp. 763808-1 to 763808-8 (2010).

Ebert, M., et al., "Combined Overlay, Focus and CD Metrology for leading Edge Lithography," Proceedings of SPIE, Optical Microlithography XXIV, vol. 7973; pp. 797311-1 to 797311-14 (2011).

Huang, G.-T., et al., "Overlay and Focus stability Control for 28 nm node on Immersion Scanners," Proceedings of SPIE, Metrology, Inspection, and Process Control for Microlithography XXV, vol. 7971; pp. 79711M-1 to 79711M-8 (2011).

Laidler, D., et al., "A Single Metrology Tool Solution for Complete Exposure Tool Setup," Proceedings of SPIE, Metrology, Inspection, and Process Control for Microlithography XXIV, vol. 7638; pp. 763809-1 to 763809-10 (2010).

Vanoppen, P., et al., "Lithographic scanner stability improvements through advanced metrology and control," Proceedings of SPIE, Optical Microlithography XXIII, vol. 7640; pp. 764010-1 to 764010-15 (2010).

International Search Report directed to related International Patent Application No. PCT/EP2012/065599, mailed Mar. 1, 2013; 2 pages.

English-Language Abstract for Japanese Patent Publication No. 10-254123 A, published Sep. 25, 1998; 1 page.

Non-Final Rejection mailed Apr. 29, 2015 for U.S. Appl. No. 14/562,133, filed Dec. 5, 2014; 11 pages.

Final Rejection mailed Sep. 29, 2015 for U.S. Appl. No. 14/562,133, filed Dec. 5, 2014; 11 pages.

Notice of Allowance mailed Jan. 19, 2016 for U.S. Appl. No. 14/562,133, filed Dec. 5, 2014; 9 pages.

\* cited by examiner

METHOD OF DETERMINING FOCUS CORRECTIONS, LITHOGRAPHIC PROCESSING CELL AND DEVICE MANUFACTURING METHOD

CROSS REFERENCE TO RELATED APPLICATIONS

This application claims the benefit under 35 U.S.C. §119(e) to U.S. Provisional Patent Application No. 61/529,586, filed Aug. 31, 2011, which is incorporated by reference herein in its entirety.

FIELD

The present invention relates to methods of inspection usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In the manufacture of devices using lithographic processes, each mask pattern is typically projected onto the target portion in focus. In practice, this means that the target portion of the substrate is positioned in a plane of best focus of the aerial image projected by the projection system. As the critical dimension (CD) (i.e., the dimension of a feature or features in which variations will cause undesirable variation in physical properties of the feature, such as the gate width of a transistor) in lithography shrinks, consistency of focus, both across a substrate and between substrates, becomes increasingly important.

The use of an alignment system to monitor focus has been proposed and involves printing focus-sensitive alignment markers at known positions relative to normal alignment markers at various different focus settings, i.e., positions of the substrate relative to the projection system. The position of these focus-sensitive markers with respect to the normal alignment markers is measured and an alignment offset (AO) can be determined which is representative of focus errors.

One way of verifying the quality of focus control in lithographic tools is by using the Leveling Verification Test (LVT). The LVT test uses a special reticle with glued glass wedges on top, to locally create non-telecentric illumination on a double telecentric lens. This non-telecentric illumination is used to cause a lateral shift in x, y as function of defocus z of the aerial image of an XPA alignment mark situated beneath a glass wedge. By measuring the alignment shift of this defocus mark with respect to XPA reference mark (imaged without wedge on top), the defocus at the moment of exposing can be determined.

A main drawback with the LVT test is that the read-out of the wafer is done by the alignment system present on the lithographic tool itself, thus reducing the time available for production.

SUMMARY

It would be desirable to determine better focus corrections which address one or more of the problems of the prior art.

According to an aspect of the invention, there is provided a method of determining focus corrections for a lithographic projection apparatus, the method comprising: measuring a focus dependent characteristic for each of a plurality of global correction marks on a test substrate to determine interfield focus variation information, and calculating interfield focus corrections from the interfield focus variation information, wherein the global correction marks are arranged in a plurality of global correction fields, each global correction field having been exposed with a tilted focus offset across it.

According to a second aspect of the present invention, there is provided a lithocell for determining focus corrections for use in a lithographic projection process, the apparatus comprising: a lithographic apparatus operable to expose, with a with a tilted focus offset across each one, a plurality of global correction fields, each comprising a plurality of global correction marks, on a test substrate, an inspection apparatus operable to measure a focus dependent characteristic for each of the plurality of global correction marks, and a processor operable to determine interfield focus variation information from the measured focus dependent characteristic and to calculate interfield focus corrections from the interfield focus variation information.

According to a further aspect of the invention there is provided a method of determining focus corrections for a lithographic projection apparatus, the method comprising:

measuring a focus dependent characteristic for each of a plurality of intrafield correction marks on a test substrate, wherein the intrafield correction marks are arranged in a plurality of intrafield correction fields, the intrafield correction marks having been exposed using varying focus, determining intrafield focus variation information for each intrafield correction mark location from the measured focus dependent characteristic, and calculating the intrafield focus corrections from the intrafield focus variation information, wherein the step of calculating intrafield focus corrections comprises taking into account scan-up-scan-down effects, whereby measured parameters show variation in dependence of the scanning direction during a lithographic process.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 11A:
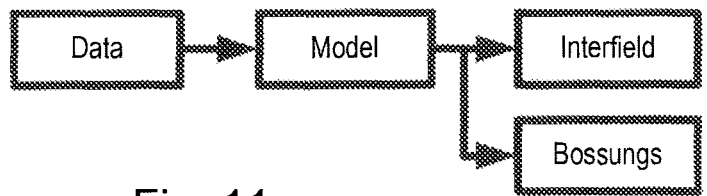
Figure 11B:
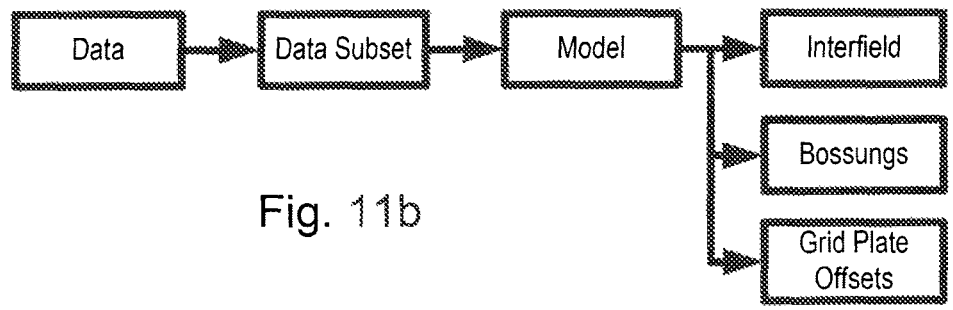
Figure 11C:
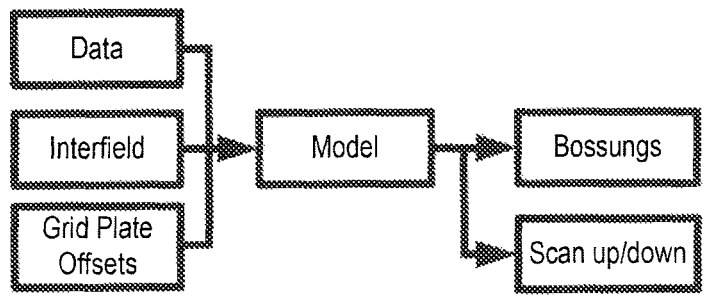

FIGS. 11*a*, 11*b* and 11*c* are flowcharts of methods according to embodiments of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
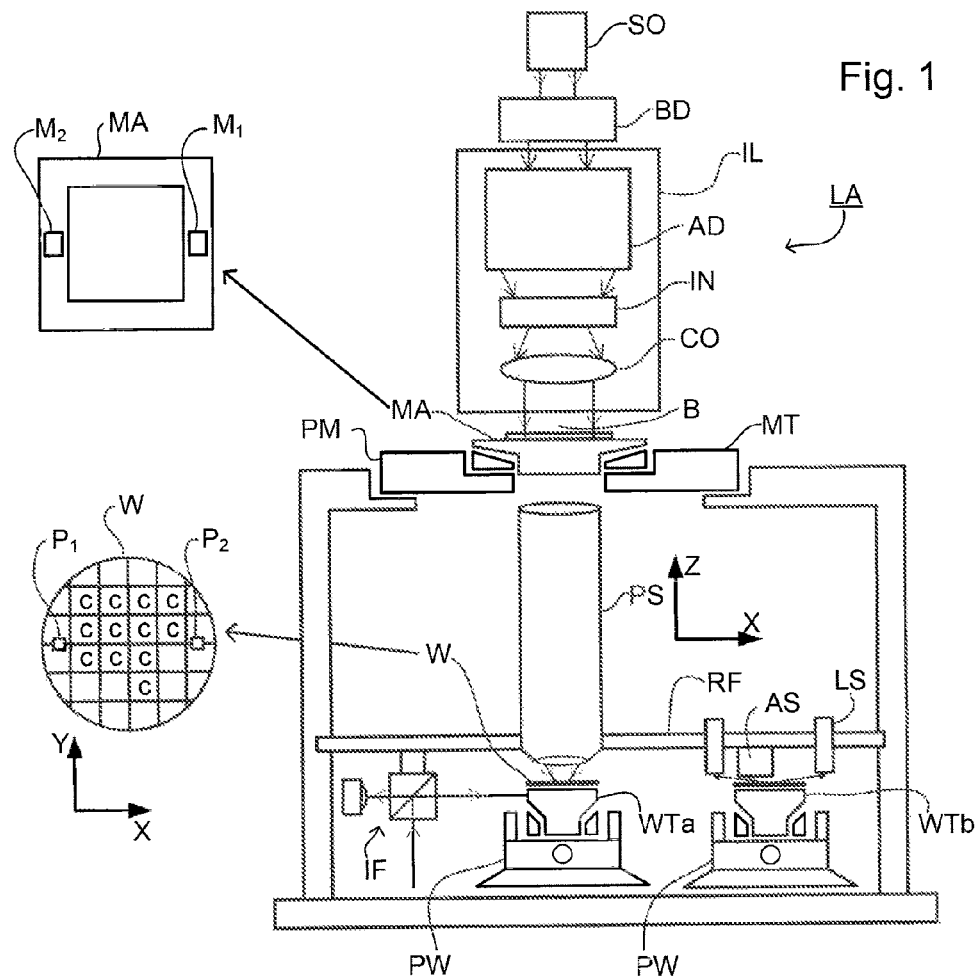
FIG. 1 depicts a lithographic apparatus.

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
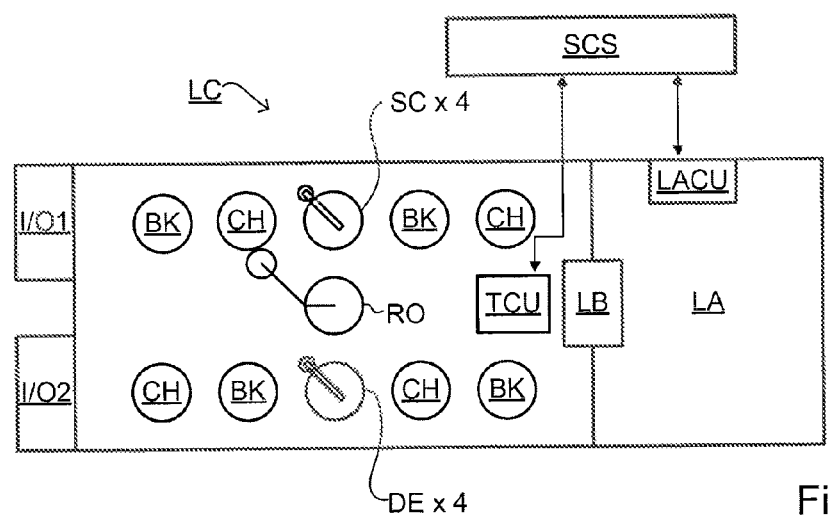
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
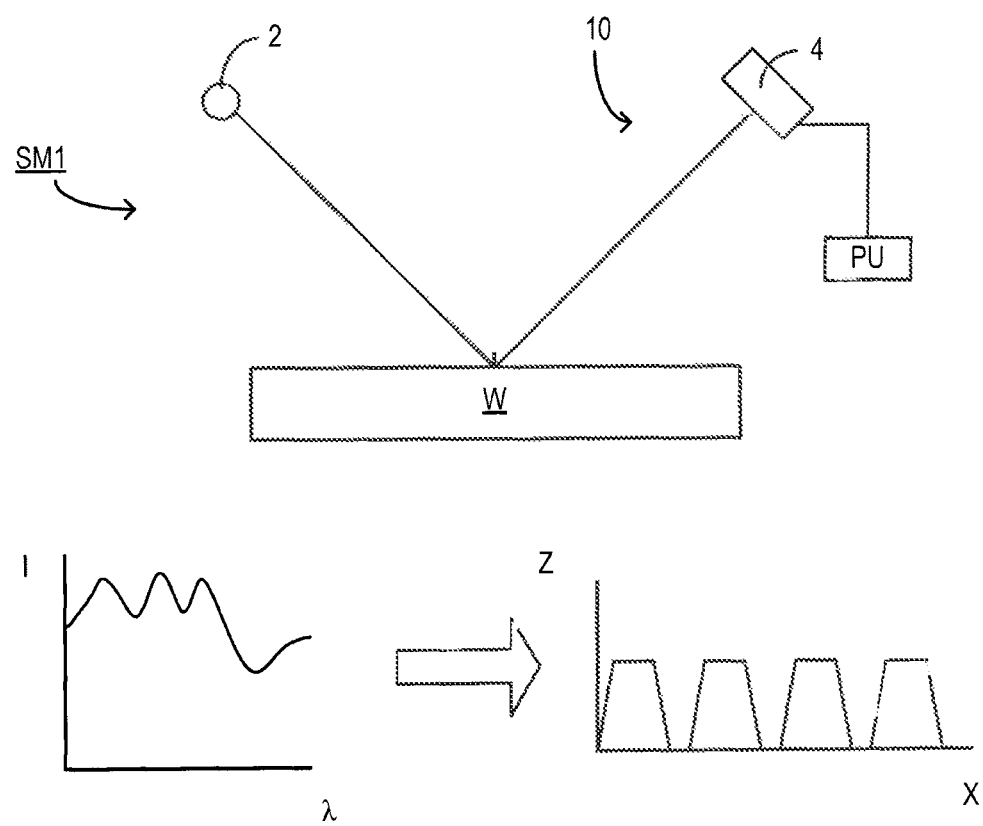
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
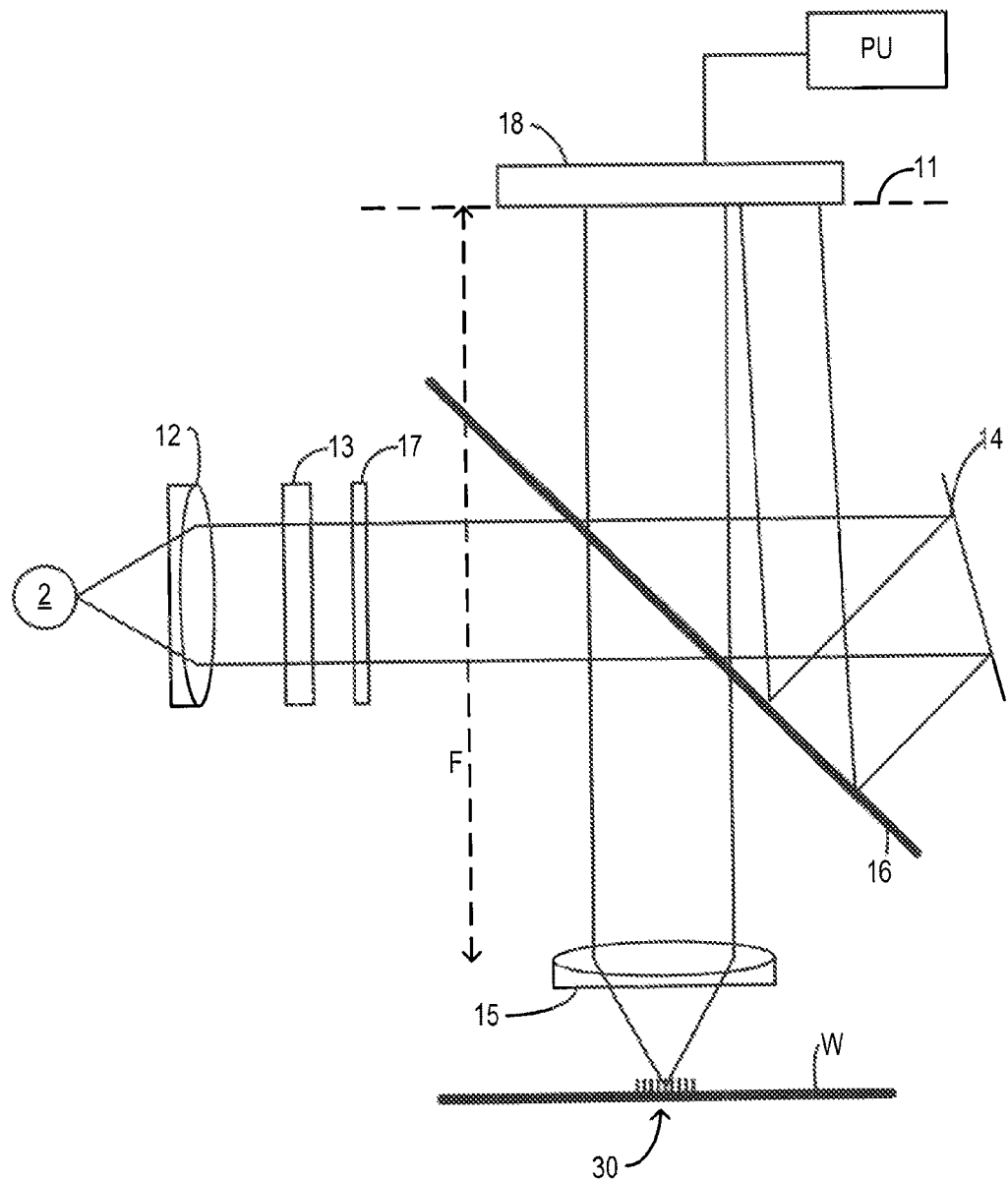
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), at least 0.9 and more at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband each has a bandwidth of Δλ and a spacing of at least 2 Δλ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

Methods have been developed to determine focus corrections for a Lithographic apparatus from middle CD (Mid-CD) and Side Wall Angle (SWA) measurements with an angular resolved scatterometer. These methods can be shown to be sensitive to process variations in the lithography process. As a consequence, remaining fingerprints in Mid-CD, SWA, Resist Height, and Barc thickness parameters may be highly correlated, such that a change in one of these parameters can produce a very similar change in the resultant spectrum when compared to a change in another of these parameters. When monitoring and controlling a lithographic process, this can result in apparent across-wafer focus fingerprints (sub 10 nm) which result in incorrect focus corrections. Moreover these methods are unlikely to be used on EUV systems. Due to the thin resists used for EUV resolution, SWA cannot be measured accurately with the current generation of scatterometers.

The methods disclosed herein are based on local determination of a Bossung-top. This is the top of the response of a Mid-CD curve through known focus offsets. Typically this is a symmetrical parabolic curve. Around the Bossung-top the focus sensitivity is minimal. Therefore this point is often considered a best focus. It is proposed to split focus correction into global across-wafer focus corrections and average across-field focus corrections.

U.S. Publ. App. 2009/00135389, incorporated herein by reference in its entirety, proposes another method of measuring focus that includes exposure of a test substrate that has a plurality of verification fields. Each of the verification fields includes a plurality of verification markers, and the verification fields are exposed using a predetermined focus offset FO. After developing, an alignment offset for each of the verification markers is measured and translated into defocus data using a transposed focal curve. This method may result in a focus-versus alignment shift sensitivity up to 50 times higher (typically dX,Y/dZ=20) than LVT.

Figure 5:
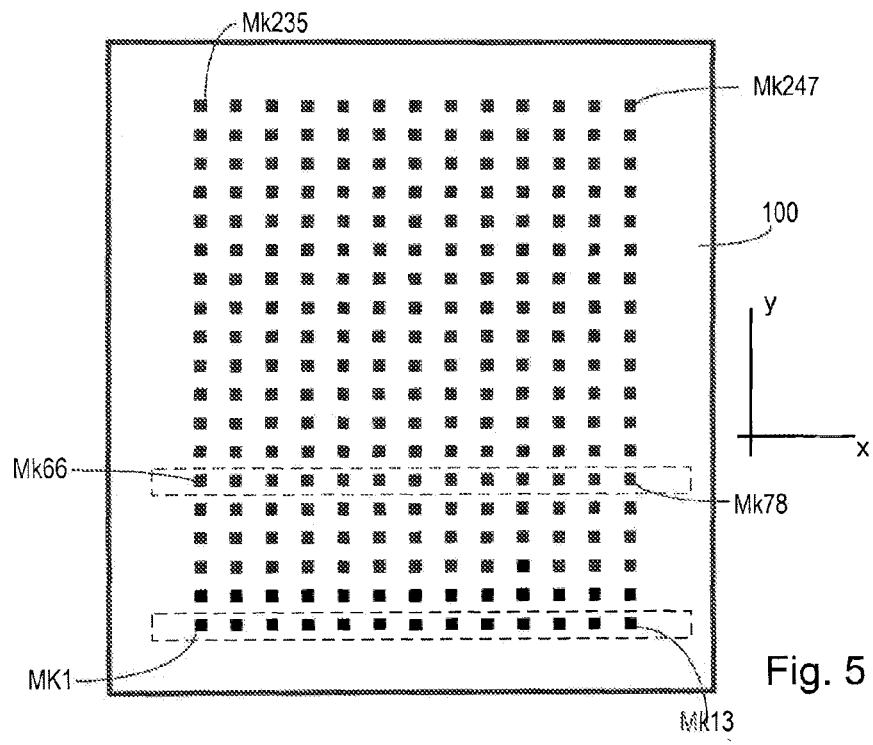
FIG. 5 depicts a reticle usable in an embodiment of the invention.

FIG. 5 shows an example of a reticle 100 that can be used to expose fields on a test wafer, when performing the methods disclosed herein. The reticle comprises a plurality of focus sensitive marks (Mk1 through to Mk247; with Mk1, Mk13, Mk66, Mk 78, Mk235 and Mk247 labelled by way of illustration). Each marker typically comprises horizontal and vertical bars. The bars in the structures may have a range of line widths and pitch sizes. Due to the particular dimensions of the structure, the line width (and therefore Mid-CD) of the bars will be focus sensitive according to the well known Bossung principle.

Figure 6:
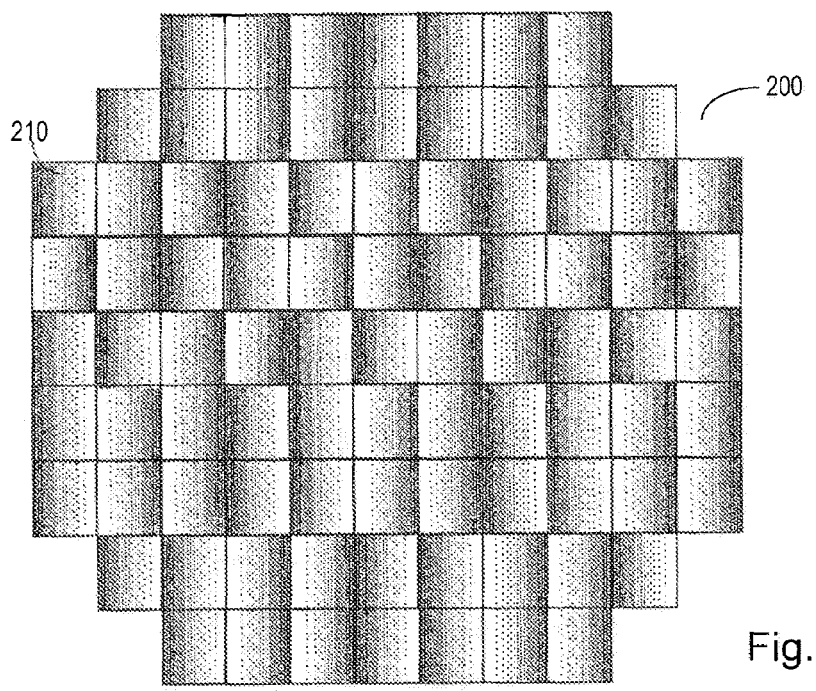
FIG. 6 depicts a substrate having been exposed with tilted fields.

FIG. 6 shows a test wafer 200, with a plurality of fields 210 (referred to as global correction fields) exposed in accordance with an embodiment of the invention. In order to perform global across-wafer focus corrections, these global correction fields are exposed using the reticle 100 with predefined Ry tilt (that is a rotation of the field around the Y axis) offsets per field. Most or all of the wafer is exposed in this way. The tilts cause rows of marks within the global correction fields to be exposed at different focus heights. This tilt is illustrated by the shading of each field in FIG. 6.

Figure 7:
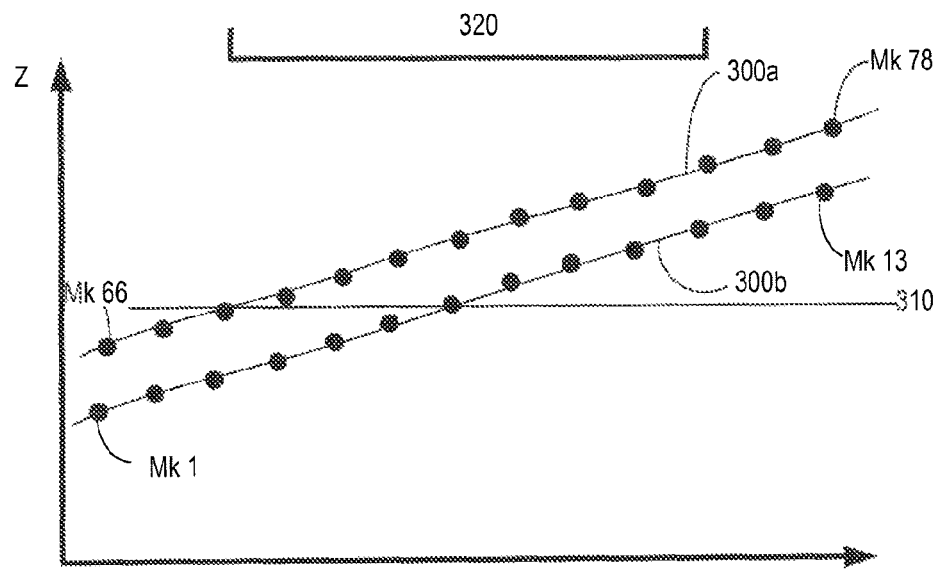
FIG. 7 shows an example on how a Ry tilt introduces Z height positions of marks of two particular rows of a field as a function of the X-position within the field.

FIG. 7 shows an example of the Z position of the marks Mk1-Mk13 of one particular row (line 300a), and marks Mk66-Mk78 of another particular row (line 300b), shown as a function of the X-position. Each of the plotted points represents a marker. The Ry tilt results in an effective tilt of the wafer surface (corresponding to lines 300a and 300b) for that field, with respect to an image plane 310. Part of a lens 320 is shown which defines the position of the image plane 310. The Ry tilt of the wafer W around the Y axis will introduce a Z defocus for marks in each of the rows of the global correction field, (i.e., Mk1-Mk13, Mk14-Mk26 . . . Mk234-Mk247) at different X positions.

Figure 8:
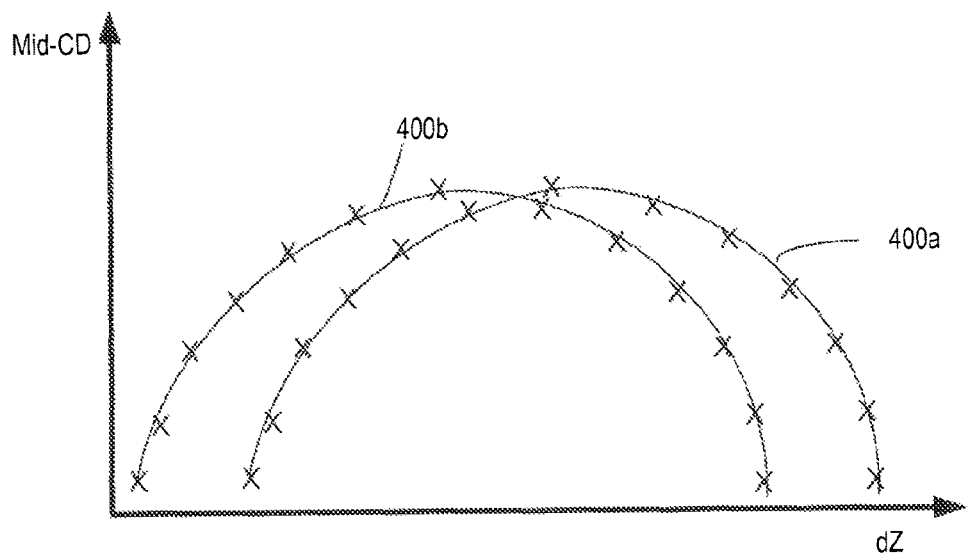
FIG. 8 shows a graph of a measured Mid-CD against focus offset for two rows of marks of one field.

FIG. 8 shows a graph of a measured Mid-CD for the two single rows of marks of FIG. 7. Within the tilted fields, the best focus is determined per row of marks, by fitting a smooth, parabolic (Bossung) curve 400a, 400b through the measured Mid-CD values and determining the position of the top of the curve relative to the center axis of the exposed row. The position of the Bossung top is the best focus offset of the row. The best focus offset values for each row are all modeled (e.g., by using a polynomial) to determine a smooth across-wafer fingerprint. This correctable part of this fingerprint can be used to control the across-wafer focus behavior of the lithography apparatus.

Of course, Rx tilts could be applied to the global correction fields instead of the Ry tilts illustrated, resulting in columns of marks being exposed at different heights, and being plotted as Bossung curves.

Figure 9:
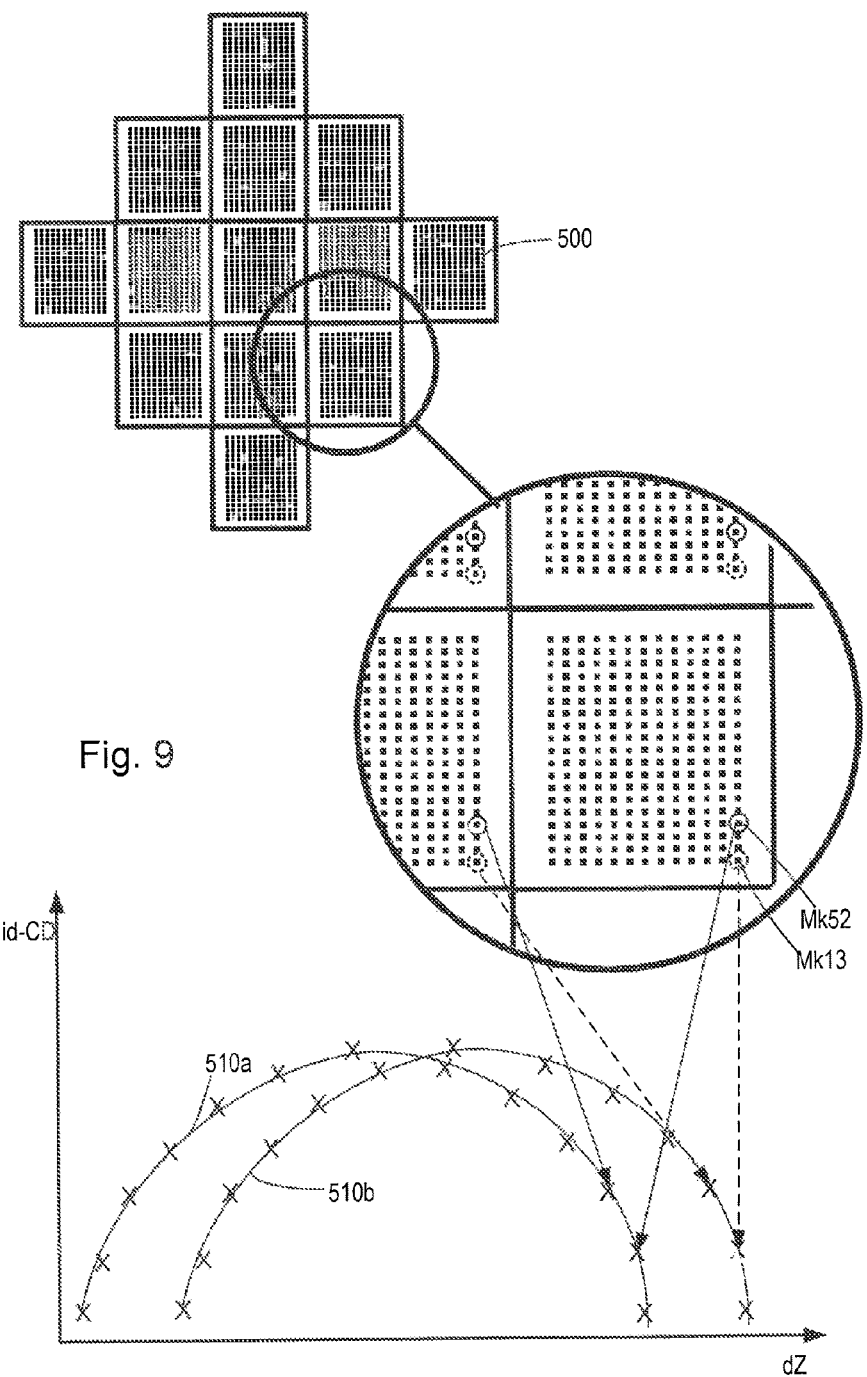
FIG. 9 illustrates the steps of determining average across-field fingerprints for a plurality of fields.

FIG. 9 illustrates how the average across-field fingerprint can now be determined. A plurality of intrafield correction fields 500 (13 are shown here, purely by way of example), are exposed on the same wafer as that previously exposed with the global correction fields, each with a different focus offset (focus meander). The intrafield correction fields are exposed with a small shift with respect to the global correction fields. The shift prevents the marks in the respective types of fields from overlapping.

A measured Mid-CD vs focus offset response curve 510a, 510b can be determined for each mark position, i.e., one curve may plot all measurements for each of the marks Mk13 from all the fields. In the example shown, curve 510a shows the curve for mark Mk52 and curve 510b shows the curve for mark Mk13. Each curve is then corrected for the effects of the across-wafer fingerprint determined according to the methods described above. The position of the top of this corrected curve reflects the defocus of the mark. All the resultant intrafield focus values can then be modeled with intra-field correctables of the lithography apparatus, so as to obtain the required corrections.

It is important to note that the FIG. 8 interfield and FIG. 9 intrafield corrections may equally be performed the opposite way round to that described above. In such a case the intrafield fingerprint can be determined first and then used to correct the interfield fingerprint obtained using the tilted fields.

Figure 10:
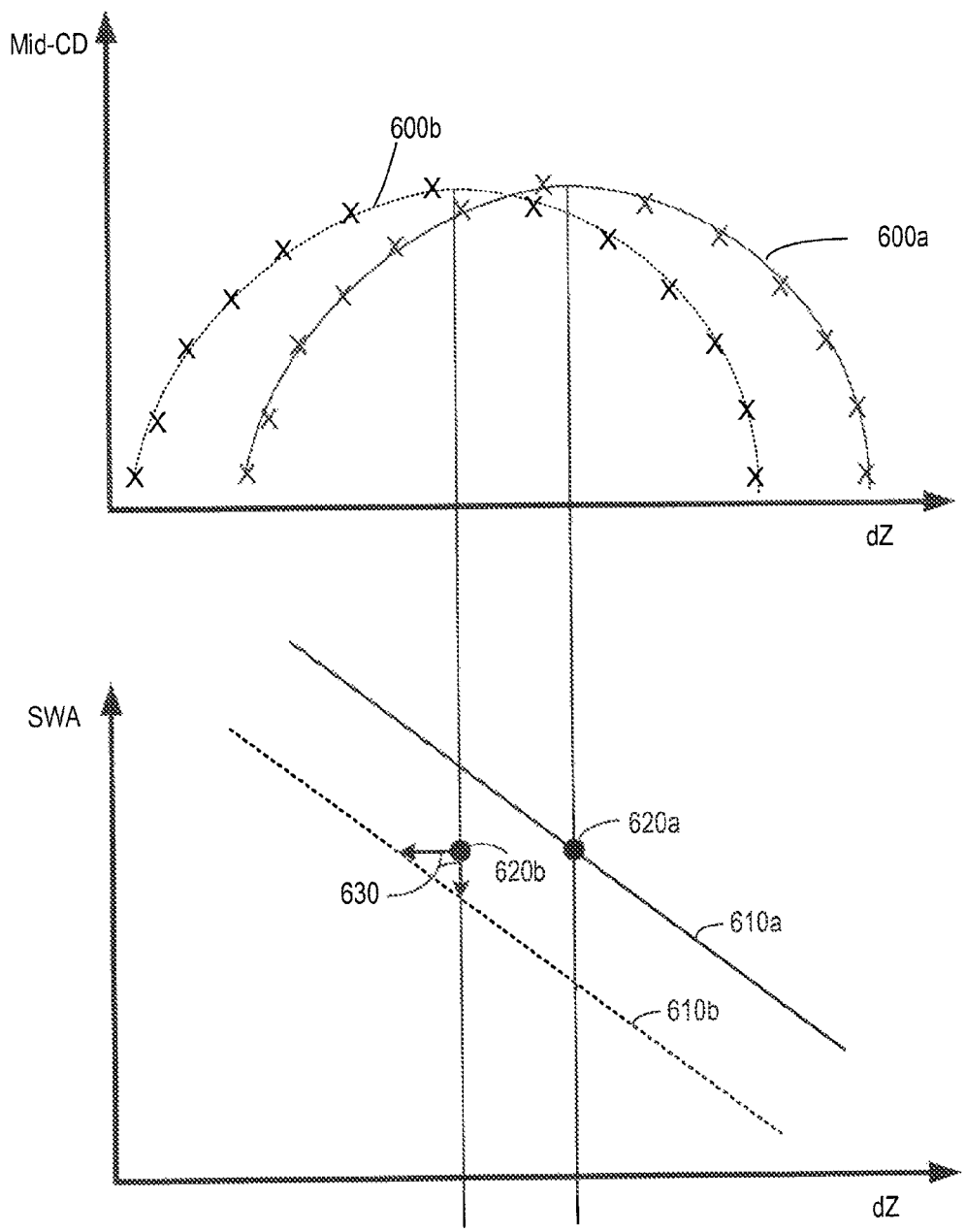
FIG. 10 illustrates how the calculated across-wafer fingerprint or intra-field fingerprint can be used to compensate for process or reticle related influences in Side Wall Angle (SWA) measurements, according to an embodiment of the invention.

FIG. 10 illustrates how, in another embodiment, the calculated across-wafer fingerprint or intra-field fingerprint described above can be used to compensate for process or reticle related influences in Side Wall Angle (SWA) measurements. In the top graph, which can be the same as the graph of FIG. 8 or FIG. 9, the Bossung-tops of the plots 600a, 600b are determined for each row/column/mark etc., thus indicating best focus. The bottom graph shows that SWA is a function of focus used during exposure and therefore SWA measurements can be used to deduce focus. Two plots are shown 610a, 610b, corresponding to plots 600a, 600b respectively. Point 620a on graph 610a is at the best focus determined using plot 600a. It should be appreciated that the SWA at each Bossung-top (best focus) should be the same, and therefore the SWA plot 610b should pass through point 620b. In this example, it does not, the differences being labeled 630. These differences represent process or reticle errors, and graph 620b can be corrected accordingly.

The SWA measurements can be taken from the tilted fields at the same time as the across-wafer fingerprint is being determined. This has the advantage of saving measurement time. However, better accuracy (at the cost of time) can be obtained by using shifted fields without tilt for the SWA measurements.

This embodiment enables dense focus characterization across-wafer and field including edge fields. The SWA measurement response curve can be more accurately anchored around best focus.

It turns out that the Bossung top determination is considerably less sensitive to process variations of the lithography process and the delicate differences between scatterometer sensors than current Mid-CD and SWA focus determination techniques. Consequently a more robust way of qualifying focus fingerprints of the lithography apparatus can be established. Correlation with existing methods such as LVT and FOCAL can be shown to be on nanometer level. Mid-CD embodiments described also have extendibility towards EUV lithography processes.

On certain systems there is a hardware issue (resultant from the grid plate) which results in four identifiable quadrants in which a particular focus error is induced for each quadrant. This error is referred to as a grid plate focus offset, and results in there being a focus offset that is different for each quadrant. Since this is not taken into account during the modeling, the fit will try to attribute these focus offsets partly to the interfield model and partly to the Bossung curves that are being modelled, with the rest being dumped into fit residuals.

In addition, the current interfield model cannot take into account scan-up-scan-down effects easily. Scanners, as previously described, tend to scan each subsequent field in opposing directions, so as to decrease the overall scanning time and increase throughput. However, hysteresis in hardware and control loops can result in an effect known as the 'scan-up-scan-down (SUSD) effect' whereby some parameters of fields that are scanned up may be measurably different to those of fields scanned down. This SUSD effect may be thought of as an intra-field effect. In order to take into account the SUSD effect, the data needs to be divided into two separate parts and the modeling performed twice on a halved data set. This strategy results in a greatly reduced accuracy of the scan effects (as the ratio of number of data points and degrees of freedom in the model is reduced drastically).

A further embodiment aims to address the above issues. This embodiment uses a full field randomized focus exposure matrix (FEM). In such an embodiment fields are exposed on a single layer with a (pseudo-) randomized (not truly random, but according to rules which aim to achieve the best possible decoupling between all the parameters to be retrieved) focus and dose settings per field. This is in contrast to the embodiments described above using tilted fields (FIGS. 6 and 7) or meandering fields (FIG. 9-a systematic FEM). Tilted fields are not used in this embodiment as there is a need to interpolate mid-CD over all intra field points. The systematic FEM, where neighbouring fields on the wafer refer to neighbouring points on the Bossung is not used as any across wafer CD variation (like a radial fingerprint) will immediately cross correlate with the Bossung and result in an error in 'Best Focus'.

The full field randomized FEM is perturbed/deformed by:
across wafer CD variation
intra field focus variation (a kind of wafer average)
grid plate focus offsets
scan up/down effects (an averaged value over all fields)
To clean up the Bossungs (and reduce the fit residuals) and to inform the customer of process quality, these effects are modeled and reported.

An interfield Bossung fit may have a linear model such as:

$$CD_{(i,j)} = \sum_{nx=0}^{N} \sum_{ny=0}^{M} a_{nx,ny} \cdot x^{nx} \cdot y^{ny} + \sum_{f=0}^{F_{max}} \sum_{d=0}^{D_{max}} c_{f,d} \cdot F^f \cdot \left(\frac{1}{D}\right)^d \quad \text{[Equation 1]}$$

The first term is an interfield component which describes the across wafer CD variation (the same coefficients for all the Bossung curves), For this first term very simple polynomials are used. Alternatives include Zernike polynomials (or other radial polynomials) or radial basis functions. The second term describes the Bossung curve (different coefficients per intrafield location). Note that for each intra-field location a separate Bossung is modeled. x and y refer to wafer coordinates, F and D to focus and dose at the given x and y coordinates on the wafer.

In order to better account for the scan-up-scan-down effects and grid plate focus offsets, it is proposed to expand the focus term F to:

$$F = \overline{F}_{i,j} - F_{i,j}\uparrow\downarrow - G(x,y) \quad \text{(Equation 2)}$$

where: $\overline{F}_{i,j}$ is the average intrafield focus offset at intrafield location (i, j), $F_{i,j}\uparrow\downarrow$ is the scan-up-scan-down difference at intra field location (i, j) and G(x,y) is the grid plate offset model.

In a simple form the grid plate offset model may be:

$$G(x, y) = \sum_{q=1}^{4} \sum_{\alpha=0}^{A} \sum_{\beta=0}^{B} H^q(x, y) \cdot g_{\alpha,\beta}^q \cdot x^\alpha \cdot y^\beta \quad \text{(Equation 3)}$$

In this example a filter H is used to filter out a quadrant (hence the dependency on x and y) and $g_{\alpha,\beta}^q$ refers to coefficients of the model which are dependent in x and y in quadrant q. This is only one implementation option, and other models may be more appropriate.

In the approaches described above (for example those described in relation to FIGS. 5-9) the method flow is relatively simple, as shown in FIG. 11*a*. The model is applied to the data and the results returned. By comparison, the method flow of the present embodiment takes a two step approach. This is required because the non-linear solution is much more complex and cannot handle a large number of degrees of freedom easily.

FIGS. 11*b* and 11*c* are flowcharts of the first step and second step respectively of this embodiment. In the first step, a subset of the data is taken, and from this the following is simultaneously fitter: inter-field CD variation, grid plate focus offsets), and a limited number of Bossungs (for example 16) on a limited number of intra-field locations. Once generic parameters are determined (inter-field CD, grid plate offsets) these results can be used to obtain more accurate Bossungs (typically a different target CD/pitch) that is measured on a denser grid (for example 13×7=91 intra-field points). The problem of the second step has been reduced in complexity and becomes straightforward to solve, while also taking into account the scan-up-scan down effects.

Further embodiments according to the invention are provided in below numbered clauses:

1. A method of determining focus corrections for a lithographic projection apparatus, the method comprising:
   measuring a focus dependent characteristic for each of a plurality of global correction marks on a test substrate to determine interfield focus variation information; and
   calculating interfield focus corrections from the interfield focus variation information; wherein the global correction marks are arranged in a plurality of global correction fields, each global correction field having been exposed with a tilted focus offset across it.

2. A method according to clause 1 wherein the global correction fields have been exposed over substantially the whole test substrate surface.

3. A method according to clause 1 or 2 wherein the tilted focus offsets are all tilted around axes that lie in the same axial direction.

4. A method according to clause 3 wherein the tilted focus offsets are tilted in different directions around the axes.

5. A method according to any preceding clause wherein the global correction marks are arranged in subsets in each global correction field, and the tilted focus offsets are such that for each subset, each global correction mark has been exposed with a different focus offset, the focus offsets varying substantially linearly along the subset; and an optimal focus for each of the subsets is determined.

6. A method according to clause 5 wherein the optimal focus for each subset is determined by plotting each measured focus dependent characteristic of each global correction mark comprised in the subset against the exposure focus offset for that global correction mark, and determining where focus sensitivity to the focus dependent characteristic is minimal.

7. A method according to clause 5 or 6 wherein the subset comprises rows or columns of global correction marks.

8. A method according to clause 5, 6 or 7 wherein the determined optimal focus values are modelled together to find the interfield focus corrections.

9. A method according to any of clauses 5 to 8 wherein the method comprises measuring side wall angle data from the test substrate and
   determining focus measurements from the side wall angle measurements; wherein the focus measurements are corrected using the interfield focus corrections.

10. A method according to clause 9 comprising the step of:
    assuming that the side wall angle values at every determined optimal focus value are all substantially equal in correcting the focus measurements.

11. A method according to any preceding clause comprising the initial step of exposing the plurality of global correction fields on the test substrate with a tilted focus offset across each one.

12. A method according to any preceding clause further comprising determining intrafield focus corrections.

13. A method according to clause 12 wherein the intrafield focus corrections are determined by:
    measuring a focus dependent characteristic for each of a plurality of intrafield correction marks on the test substrate to determine intrafield focus variation information; and
    calculating the intrafield focus corrections from the intrafield focus variation information; wherein the intrafield correction marks are arranged in a plurality of intrafield correction fields, each intrafield correction field having been exposed using a focus offset.

14. A method according to clause 12 or 13 wherein the interfield focus variation information is used in determining the intrafield focus corrections, so as to obtain corrections for both interfield and intrafield effects.

15. A method according to clause 12 or 13 wherein the intrafield focus variation information is used in determining the interfield focus corrections, so as to obtain corrections for both interfield and intrafield effects.

16. A method according to any of clauses 13 to 15 wherein each intrafield correction field has been exposed with a different focus offset.

17. A method according to any of clauses 13 to 16 wherein the intrafield focus variation information is determined by:
    plotting each measured focus dependent characteristic for each intrafield correction mark in corresponding positions in each intrafield correction field against the exposure focus offset for that intrafield correction marks, and determining where focus sensitivity to the focus dependent characteristic is minimal.

18. A method according to any of clauses 13 to 17 wherein each intrafield correction fields has been exposed with a positional offset from the global correction fields such that the global correction marks and the intrafield correction marks do not overlap.

19. A method according to any of clauses 13 to 18 wherein the method comprises measuring side wall angle data from the test substrate and
    determining focus measurements from the side wall angle measurements; wherein the focus measurements are corrected using the intrafield focus corrections.

20. A method according to clause 19 comprising:
    determining an optimal focus for each of a plurality of subsets of intrafield correction marks; and
    assuming that the side wall angle value at each optimal focus value are all substantially equal in correcting the focus measurements.

21. A method according to any of clauses 13 to 20 comprising exposing the plurality of intrafield correction fields on the test substrate.

22. A method according to any preceding clause wherein the focus dependent characteristic is related to critical dimension.

23. A method according to any preceding clause comprising using the determined focus corrections in a subsequent lithography process.

24. A method according to clause 23 wherein all the steps of determining process corrections are performed on an inspection tool separate from the lithography tool, such that the process corrections can be determined during the lithography process.

25. A lithocell for determining focus corrections for use in a lithographic projection process, the apparatus comprising:
a lithographic apparatus operable to expose, with a with a tilted focus offset across each one, a plurality of global correction fields, each comprising a plurality of global correction marks, on a test substrate;
an inspection apparatus operable to measure a focus dependent characteristic for each of the plurality of global correction marks; and
a processor operable to determine interfield focus variation information from the measured focus dependent characteristic and to calculate interfield focus corrections from the interfield focus variation information.

26. A lithocell according to clause 25 wherein the lithographic apparatus is operable to expose the global correction fields over substantially the whole test substrate surface.

27. A lithocell according to clause 25 or 26 wherein the lithographic apparatus is operable to expose the global correction fields such that the tilted focus offsets are all tilted around axes that lie in the same axial direction.

28. A lithocell according to clause 27 wherein the lithographic apparatus is operable to expose the global correction fields such that the tilted focus offsets are tilted in different directions around the axes.

29. A lithocell according to any of clauses 25 to 28 wherein the lithographic apparatus is operable to expose the global correction fields such that the global correction marks are arranged in subsets in each global correction field, and the tilted focus offsets are such that for each subset, each global correction mark is exposed with a different focus offset, the focus offsets varying substantially linearly along the subset; and
the processor is operable to determine an optimal focus for each of the subsets.

30. A lithocell according to clause 29 the processor is operable to determine the optimal focus for each subset by plotting each measured focus dependent characteristic of each global correction mark comprised in the subset against the exposure focus offset for that global correction mark, and by determining where focus sensitivity to the focus dependent characteristic is minimal.

31. A lithocell according to clause 29 or 30 wherein the subset comprises rows or columns of global correction marks.

32. A lithocell according to clause 29, 30 or 31 wherein the processor is operable to model together the optimal focus values to find the interfield focus corrections.

33. A lithocell according to any of clauses 29 to 32 wherein the inspection apparatus is operable to measure side wall angle data from the test substrate and
the processor is operable to determine focus measurements from the side wall angle measurements; and to correct the focus measurements using the interfield focus corrections.

34. A lithocell according to clause 33 the processor is operable to assume that the side wall angle values at every determined optimal focus value are all substantially equal.

35. A lithocell according to any of clauses 25 to 34 being further operable to determine intrafield focus corrections.

36. A lithocell according to clause 35 wherein:
the lithographic apparatus is operable to expose a plurality of intrafield correction fields on the test substrate, each of the intrafield correction fields comprising a plurality of intrafield correction marks, wherein the intrafield correction fields are each exposed using a focus offset;

the inspection apparatus is operable to measuring a focus dependent characteristic for each of the plurality of intrafield correction marks; and
the processor is operable to determine intrafield focus variation information from the measured focus dependent characteristic for each of the plurality of intrafield correction marks and to calculate the intrafield focus corrections from the intrafield focus variation information.

37. A lithocell according to clause 35 or 36 wherein the processor is operable to determine the intrafield focus corrections using the interfield focus variation information, so as to obtain corrections for both interfield and intrafield effects.

38. A lithocell according to clause 35 or 36 wherein the processor is operable to determine the interfield focus corrections using the intrafield focus variation information, so as to obtain corrections for both interfield and intrafield effects.

39. A lithocell according to clause 36 to 38 the lithographic apparatus is operable to expose each intrafield correction field with a different focus offset.

40. A lithocell according to clause 36 to 39 wherein the processor is operable to determine the intrafield focus variation information by:
plotting each measured focus dependent characteristic for each intrafield correction mark in corresponding positions in each intrafield correction field against the exposure focus offset for that intrafield correction marks, and determining where focus sensitivity to the focus dependent characteristic is minimal.

41. A lithocell according to any of clauses 36 to 40 wherein the lithographic apparatus is operable to expose each intrafield correction fields with a positional offset from the global correction fields such that the global correction marks and the intrafield correction marks do not overlap.

42. A lithocell according to any of clauses 36 to 41 wherein the inspection apparatus is operable to measure side wall angle data from the test substrate and
the processor is operable to determine focus measurements from the side wall angle measurements; and to correct the focus measurements using the intrafield focus corrections.

43. A lithocell according to clause 42 wherein the processor is operable to:
determine an optimal focus for each of a plurality of subsets of intrafield correction marks; and
assume that the side wall angle value at each optimal focus value are all substantially equal.

44. A lithocell according to any of clauses 25 to 43 wherein the focus dependent characteristic is related to critical dimension.

45. A method of determining focus corrections for a lithographic projection apparatus, the method comprising:
measuring a focus dependent characteristic for each of a plurality of intrafield correction marks on a test substrate, wherein the intrafield correction marks are arranged in a plurality of intrafield correction fields, the intrafield correction marks having been exposed using varying focus;
determining intrafield focus variation information for each intrafield correction mark location from the measured focus dependent characteristic;
calculating the intrafield focus corrections from the intrafield focus variation information; wherein the step of calculating intrafield focus corrections comprises taking into account scan-up-scan-down effects, whereby measured parameters show variation in dependence of the scanning direction during a lithographic process.

46. A method according to clause 45 wherein the step of calculating intrafield focus corrections comprises modelling the intrafield focus variation information in terms of the average intrafield focus offset at each intrafield location and the difference resultant from the scan-up-scan-down effect at each intrafield location.

47. A method according to clause 45 or 46 wherein the exposing of the intrafield correction marks using varying focus comprises exposing the correction marks on a single layer with pseudo-randomized focus and dose settings per field.

48. A method according to any of clauses 45 to 47 wherein the step of calculating intrafield focus corrections comprises taking separately into account grid plate focus errors induced as a result of a grid plate forming part of the lithographic apparatus.

49. A method according to clause 48 wherein the grid plate focus errors are induced per wafer quadrant and the step of calculating intrafield focus corrections comprises modelling the different intrafield focus variation information using a filter to filter out a particular quadrant of the test substrate.

50. A method according to any of clauses 45 to 49 wherein the step of calculating intrafield focus corrections comprises the steps of:
    simultaneously modelling interfield components of the focus corrections for only a subset of the measured focus dependent characteristics and intrafield components obtained from only a subset of the intrafield correction fields so as to obtain generic interfield components; and
    using the generic interfield components and the full set of measured focus dependent characteristics to determine the scan-up-scan-down effect at each location.

51. A method according to clause 50 wherein the calculated interfield components and the full set of measured focus dependent characteristics are used in modeling the average intrafield focus offset at each intrafield location as a Bossung curve.

52. A method according to clause 50 or 51 wherein the interfield components comprise the cross wafer critical dimension signature and grid plate focus errors.

53. A method as according to any of clauses 45 to 49 wherein the intrafield focus variation information is modeled as a Bossung curve, and wherein, for every intrafield location, a separate Bossung curve is modelled.

54. A lithocell for determining focus corrections for use in a lithographic projection process, the apparatus comprising:
    a lithographic apparatus operable to expose, a plurality of intrafield correction marks on a test substrate, wherein the intrafield correction marks are arranged in a plurality of intrafield correction fields, the intrafield correction marks having been exposed with a pseudo-randomized focus and dose settings per field;
    an inspection apparatus operable to measure a focus dependent characteristic for each of the plurality of intrafield correction marks; and
    a processor operable to determine intrafield focus variation information for each intrafield correction mark location from the measured focus dependent characteristic, and to calculate intrafield focus corrections from the intrafield focus variation information; wherein the step of calculating intrafield focus corrections comprises taking into account scan-up-scan-down effects, whereby measured parameters show variation in dependence of the scanning direction during a lithographic process.

55. A lithocell according to clause 54 wherein the processor is further operable to model the intrafield focus variation information in terms of the average intrafield focus offset at each intrafield location and the difference resultant from the scan-up-scan-down effect at each intrafield location.

56. A lithocell according to any of clauses 54 or 55 wherein the processor is operable to take separately into account grid plate focus errors induced as a result of a grid plate forming part of the lithographic apparatus.

57. A lithocell according to clause 56 wherein the grid plate focus errors are induced per wafer quadrant the processor is operable to calculate the intrafield focus corrections by modelling the different intrafield focus variation information using a filter to filter out a particular quadrant of the test substrate.

58. A lithocell according to any of clauses 54 to 57 wherein the processor is operable to:
    calculate interfield components of the focus corrections for only a subset of the measured focus dependent characteristics; and
    use the calculated interfield components and the full set of measured focus dependent characteristics to determine the scan-up-scan-down effect at each location.

59. A lithocell according to clause 58 wherein the processor is operable to use the calculated interfield components and the full set of measured focus dependent characteristics in modeling the average intrafield focus offset at each intrafield location as a Bossung curve.

60. A lithocell according to clause 58 or 59 wherein the interfield components comprise the cross wafer critical dimension signature and grid plate focus errors.

61. A lithocell according to any of clauses 54 to 57 wherein the processor is operable to model the intrafield focus variation information as a Bossung curve, and wherein, for every intrafield location, a separate Bossung curve is modelled.

62. A computer program product comprising program instructions operable to carry out the method of any of clauses 1 to 24 when run on suitable apparatus.

63. A computer program product comprising program instructions operable to carry out the method of any of clauses 45 to 53 when run on suitable apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining focus corrections for a lithographic projection apparatus, the method comprising:
    measuring a focus dependent characteristic for each of a plurality of marks arranged in a first plurality of fields on a test substrate to determine focus variation information, each field having been exposed with a tilted focus offset across it, such that each row or each column of marks within a given field has been exposed with a different focus offset, the focus offsets varying substantially linearly along each field;
    measuring a second focus dependent characteristic for each of a second plurality of marks arranged in a second plurality of fields to determine second focus variation information, wherein each of the second plurality of fields has been exposed with a different focus offset from one another, and wherein the second plurality of fields has been exposed on the test substrate;
    calculating focus corrections from the focus variation information;
    determining an optimal focus for each of the first plurality of fields by plotting each measured focus dependent characteristic of each mark in a given field of the first plurality of fields against the exposure focus offset for that mark; and
    determining where focus sensitivity to the focus dependent characteristic is minimal.

2. The method of claim 1, wherein the focus dependent characteristic is related to critical dimension.

3. The method of claim 1, wherein the calculating comprises calculating focus corrections based on the focus variation information and the second focus variation information.

4. The method of claim 1, wherein the second plurality of fields are exposed such that each of the second plurality of fields is shifted with respect to each of the first plurality of fields.

5. An apparatus for determining focus corrections for use in a lithographic projection process, the apparatus comprising:
    a lithographic apparatus configured to:
        expose, with a tilted focus offset across each one, a plurality of fields, each comprising a plurality of marks arranged in a first plurality of fields, on a test substrate, wherein the tilted focus offsets are such that, for each field, each row or each column of marks is exposed with a different focus offset, the focus offsets varying substantially linearly along each field, and
        expose a second plurality of marks arranged in a second plurality of fields, wherein each of the second plurality of fields is exposed with a different focus offset from one another, and wherein the second plurality of fields are exposed on the test substrate;
    an inspection apparatus configured to measure a focus dependent characteristic for each of the plurality of marks and a second focus dependent characteristic for each of the second plurality of marks; and
    a processor configured to:
        determine focus variation information from the measured focus dependent characteristic and to calculate focus corrections from the focus variation information, and
        determine an optimal focus for each of the first plurality of fields by plotting each measured focus dependent characteristic of each mark in a given field of the first plurality of fields against the exposure focus offset for that mark, and by determining where focus sensitivity to the focus dependent characteristic is minimal.

6. The apparatus of claim 5, wherein the focus dependent characteristic is related to critical dimension.

7. The apparatus of claim 5, wherein the processor is configured to determine focus variation information from the measured focus dependent characteristic from each of the plurality of marks and the second measured focus dependent characteristic from each of the second plurality of marks.

8. The apparatus of claim 5, wherein the second plurality of fields are exposed such that each of the second plurality of fields is shifted with respect to each of the first plurality of fields.

9. A tangible non-transitory computer readable storage medium having program instructions stored thereon, execution of which by at least one processor cause the at least one processor to perform operations comprising:
- measuring a focus dependent characteristic for each of a plurality of marks arranged in a first plurality of fields on a test substrate to determine focus variation information, each field having been exposed with a tilted focus offset across it, such that each row or each column of marks within a given field has been exposed with a different focus offset, the focus offsets varying substantially linearly along each field;
- measuring a second focus dependent characteristic for each of a second plurality of marks arranged in a second plurality of fields to determine second focus variation information, wherein each of the second plurality of fields has been exposed with a different focus offset from one another, wherein the second plurality of fields has been exposed on the test substrate;
- calculating focus corrections from the focus variation information;
- determining an optimal focus for each of the first plurality of fields by plotting each measured focus dependent characteristic of each mark in a given field of the first plurality of fields the subset against the exposure focus offset for that mark; and
- determining where focus sensitivity to the focus dependent characteristic is minimal.

\* \* \* \* \*